United States Patent [19]

Remington et al.

[11] Patent Number: 4,661,724
[45] Date of Patent: Apr. 28, 1987

[54] ROW DECODER

[75] Inventors: Scott Remington; William L. Martino, Jr., both of Austin, Tex.

[73] Assignee: Motorola, Inc., Schaumburg, Ill.

[21] Appl. No.: 731,199

[22] Filed: May 6, 1985

[51] Int. Cl.$^4$ .................. H03K 19/094; H03K 19/20; H03K 17/16; G11C 8/00

[52] U.S. Cl. ................. 307/449; 307/200 B; 365/230

[58] Field of Search ............... 307/449, 463, 200 B; 365/230, 231; 340/804

[56] References Cited

U.S. PATENT DOCUMENTS

| | | | |
|---|---|---|---|
| 4,145,622 | 3/1979 | Hofmann et al. | 365/230 X |
| 4,194,130 | 3/1980 | Moench | 365/230 X |
| 4,200,917 | 4/1980 | Moench | 307/449 X |
| 4,259,731 | 3/1981 | Moench | 365/230 X |
| 4,401,903 | 8/1983 | Iizuka | 307/449 |
| 4,470,133 | 9/1984 | Tanimoto | 365/231 X |
| 4,477,739 | 10/1984 | Proebsting et al. | 307/449 |
| 4,509,148 | 4/1985 | Asano et al. | 365/230 |
| 4,584,674 | 4/1986 | Watanabe | 365/230 |

OTHER PUBLICATIONS

Schlageter, "Two 4K Static 5-V Ram's"; *IEEE-JSSC*; vol. SC-11, No. 5, pp. 602-608; 10/1976.

Parikh, "High-Speed FET Decoder"; *IBM IDB*; vol. 18, No. 12, pp. 3955-3956; 5/1976.

*Primary Examiner*—Stanley D. Miller
*Attorney, Agent, or Firm*—John A. Fisher; Jeffrey Van Myers; James L. Clingan, Jr.

[57] ABSTRACT

A row decoder includes a logic decoder, a word line driver circuit, and first and second coupling circuits. The logic decoder provides a logic high in an inactive cycle and when selected in an active cycle, and a logic low when deselected in the active cycle. Each of a plurality of word line driver circuits receive a decoded address signal which corresponds to that particular driver circuit, each have an output coupled to a corresponding word line, and each have an input which, when at a logic high, causes that word line driver to couple its corresponding decoded address signal to its corresponding word line. The first coupling circuit couples the output of the logic decoder to the input of only the driver circuit which corresponds to an active decoded address signal during the active cycle, and for coupling the output of the logic decoder to all of the driver circuits in the inactive cycle. The second coupling circuit couples the word line which corresponds to the active decoded signal to the output of the logic decoder when the logic decoder is deselected during the active cycle.

16 Claims, 2 Drawing Figures

ROW DECODER

FIELD OF THE INVENTION

The present invention relates to decoders, and more particularly, to decoders for use in memories in which unselected word lines are to be held at a predetermined reference voltage.

BACKGROUND OF THE INVENTION

In memories, individual memory cells are aligned along rows and columns. Each row has a word line to which cells along that row are attached. The cells along a row are enabled when the word line to which the cells are attached is enabled. It is important that only the word line for the selected row be enabled. Due to capacitive coupling of various clock signals with fast switching times, it is possible to enable a word line of an unselected row with capacitive coupling unless measures are taken to prevent this. This is typically achieved by clamping deselected word lines to ground which, although effective, has required large pull-down transistors, the layout of which tends to limit the pitch of the word lines, i.e., limit how close together the word lines can be.

Also typical of memory row decoders is that they are NOR decoders which have a relatively high input capacitance. This causes significant loading to the address buffers which provide the address signals to the decoders. The address signals are input to the gates of transistors which form the NOR decoder. The output of the NOR decoder is on the drains of these transistors. The output is thus inverted from the input. Consequently, the gate to drain capacitance is always charged between a logic high and a logic low. Consequently, a change in state of the NOR decoder not only requires that the gate to drain capacitance be charged but also be discharged to the opposite polarity. This also adversely affects the speed of the decoder.

SUMMARY OF THE INVENTION

An object of the present invention is to provide an improved row decoder.

Another object of the invention is to provide a row decoder with an improved technique for affirmatively holding all deselected word lines at ground potential.

These and other objects are achieved in a a row decoder which has an active cycle and an inactive cycle, enables at least one of a plurality of word lines when selected, wherein an enabled word line corresponds to a decoded signal which is active. The row decoder has a logic decoder, a plurality of word line driver circuits, a first coupling circuit, and a second coupling circuit. The logic decoder has an input for receiving a plurality of address signals, and an output for providing an output signal at a first logic state during the inactive cycle, at the first logic state during the active cycle when the logic decoder is selected by the address signals, and at a second logic state during the active cycle when the logic decoder is deselected by the address signals. Each of the word line driver circuits has a control input, a driver input for receiving a decoded signal which corresponds to the driver circuit, and an output coupled to a corresponding word line which corresponds to the driver circuit. Each of the word line driver circuits couples the corresponding decoded signal to the corresponding word line when the first logic state is present on the control input. The first coupling circuit couples the output of the logic decoder to only the driver circuit which corresponds to the active decoded signal during the active cycle, and couples the output of the logic decoder to all of the plurality of word line driver circuits during the inactive cycle. The second coupling circuit couples the word line which corresponds to the active decoded signal to the output of the logic decoder when the decoder is deselected during the active cycle.

DESCRIPTION OF THE INVENTION

Figure 1:
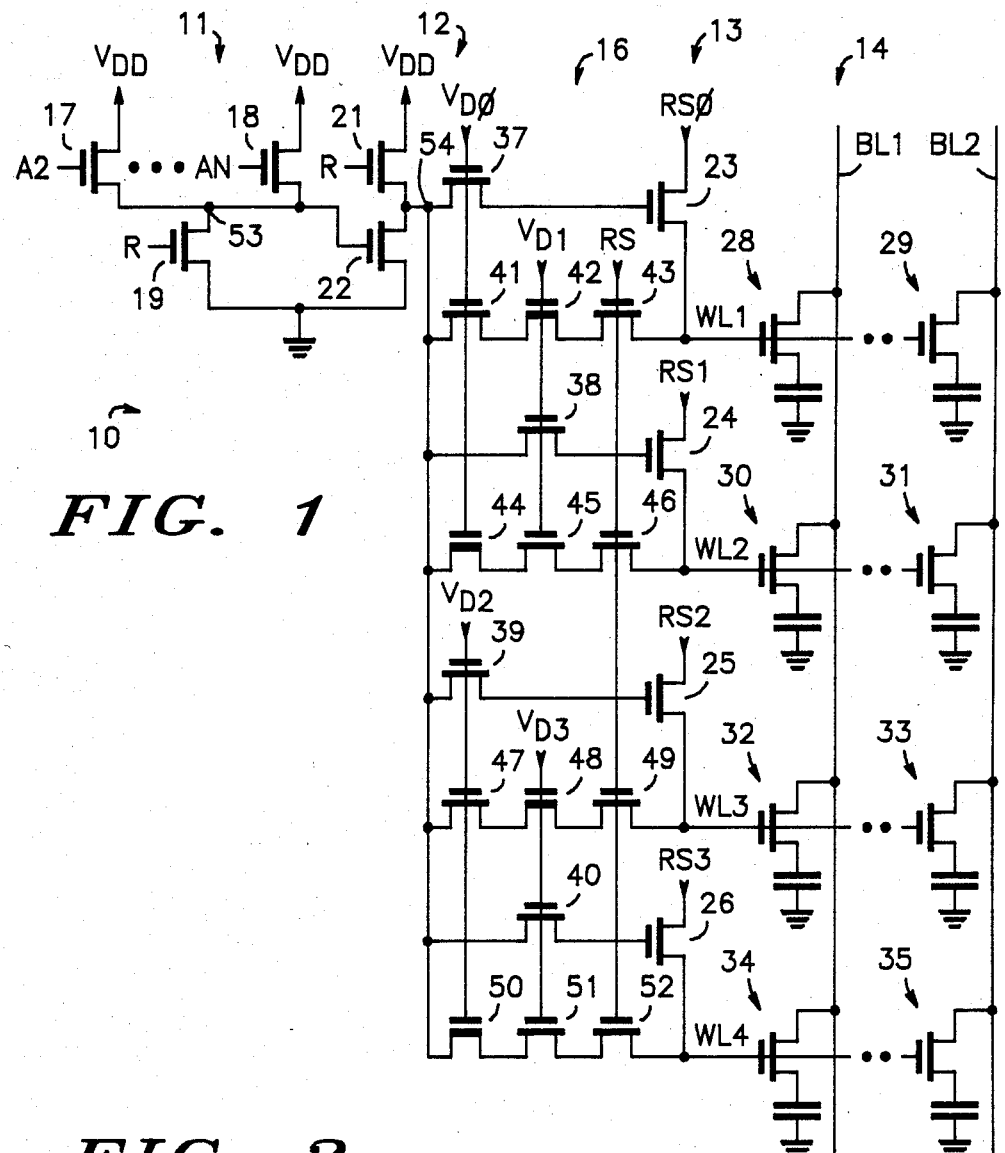
FIG. 1 is a circuit diagram of a decoder according to a preferred embodiment of the invention.

Shown in FIG. 1 is a row decoder 10 comprised generally of a main decoder 11, an inverter 12, a word-line-driver circuit 13, a memory array 14, and a coupling circuit 16. Main decoder 11 comprises transistors 17, 18, and 19. Inverter 12 comprises transistors 21 and 22. Word-line-driver circuit 13 comprises transistors 23, 24, 25, and 26. Memory array 14 comprises dynamic random access memory (DRAM) cells 28, 29, 30, 31, 32, 33, 34, and 35. Coupling circuit 16 comprises transistors 37, 38, 39, 40, 41, 42, 43, 44, 45, 46, 47, 48, 49, 50, 51, and 52. All of the transistors except transistors 42, 44, 48, and 50 are N channel insulated gate transistors of the enhancement type with a threshold voltage of 0.5 to 0.8 volt. Transistors 42, 44, 48, and 50 are N channel insulated gate field effect transistors of the depletion type with a threshold voltage of −3.0 to −4.0 volts.

Transistor 17 has gate for receiving an address signal A2, a drain connected to a positive power supply terminal VDD for receiving, for example, 5 volts, and a source connected to a node 53. Transistor 18 has a gate for receiving an address signal AN, a drain connected to VDD, and a source connected to node 53. Other transistors connected between VDD and node 53 and which receive other address signals are not shown for convenience. Transistor 19 has a gate for receiving a row signal, a drain connected to node 53, and a source connected to ground. Transistor 21 has a gate for receiving signal R, drain connected to VDD, and a source connected to a node 54. Transistor 22 has a gate connected to node 53, a drain connected to node 54, and a source connected to ground. Transistors 23–26 and 37–40 in particular use the bilateral nature of insulated gate field effect transistors. Transistor 37 has a first current electrode coupled to node 54, a control electrode for receiving a decoded address coupling signal VDØ, and a second current electrode. Transistor 23 has a control electrode coupled to the second current electrode of transistor 37, a first current electrode for receiving a decoded address driver signal RSØ, and a second current electrode connected to a word line WL1. Transistor 41 has a first current electrode coupled to node 54, a control electrode for receiving signal VDØ, and a second current electrode. Transistor 42 has a first current electrode connected to the second current electrode of transistor 41, a control electrode for receiving a decoded address coupling signal VD1, and a second current electrode. Transistor 43 has a first current electrode connected to the second current electrode of transistor 42, a control electrode for receiving an address driver active signal RS, and a second current electrode coupled to word line WL1. Transistor 38 has a first current electrode connected to node 54, a control electrode for receiving signal VD1, and a second current electrode. Transistor 24 has a control electrode connected to the second current electrode of transistor 38, a first current electrode for receiving decoded address driver signal RS1, and a second current electrode connected to a word line WL2. Transistor 44 has a first current electrode connected to node 54, a control electrode for receiving signal VD∅, and a second current electrode. Transistor 45 has a first current electrode connected to the second current electrode of transistor 44, a control electrode for receiving signal VD1, and a second current electrode. Transistor 46 has a first current electrode connected to the second current electrode of transistor 45, a control electrode for receiving signal RS, and a second current electrode connected to word line WL2.

Transistor 39 has a first current electrode coupled to node 54, a control electrode for receiving a decoded address coupling signal VD2, and a second current electrode. Transistor 25 has a control electrode coupled to the second current electrode of transistor 39, a first current electrode for receiving a decoded address driver signal RS2, and a second current electrode connected to a word line WL3. Transistor 47 has a first current electrode coupled to node 54, a control electrode for receiving signal VD2, and a second current electrode. Transistor 48 has a first current electrode connected to the second current electrode of transistor 47, a control electrode for receiving a decoded address coupling signal VD3, and a second current electrode. Transistor 49 has a first current electrode connected to the second current electrode of transistor 48, a control electrode for receiving signal RS, and a second current electrode coupled to word line WL3. Transistor 40 has a first current electrode connected to node 54, a control electrode for receiving signal VD3, and a second current electrode. Transistor 26 has a control electrode connected to the second current electrode of transistor 40, a first current electrode for receiving decoded address driver signal RS3, and a second current electrode connected to a word line WL4. Transistor 50 has a first current electrode connected to node 54, a control electrode for receiving signal VD2, and a second current electrode. Transistor 51 has a first current electrode connected to the second current electrode of transistor 50, a control electrode for receiving signal VD3, and a second current electrode. Transistor 52 has a first current electrode connected to the second current electrode of transistor 51, a control electrode for receiving signal RS, and a second current electrode connected to word line WL4.

Memory array 14 is coupled to word lines WL1, WL2, WL3, and WL4 and to bit lines BL1 and BL2. Cell 28 has an input connected to word line WL1 and an output connected to bit line BL1. Cell 29 has an input connected to word line WL1 and an output connected to bit line BL2. Cell 30 has an input connected to word line WL2 and an output connected to bit line BL1. Cell 31 has an input connected to word line WL2 and an output connected to bit line BL2. Cell 32 has an input connected to word line WL3 and an output connected to bit line BL1. Cell 33 has an input connected to word line WL3 and an output connected to bit line BL2. Cell 34 has an input connected to word line WL4 and an output connected to bit line BL1. Cell 35 has an input connected to word line WL4 and an output connected to bit line BL2. Of course many other memory cells are connected to word lines WL1, WL2, WL3, and WL4 than those shown.

In the operation of row decoder 10, there is an active cycle and an inactive cycle. Signal R is a logic high during the inactive cycle and is a logic low during the active cycle. During the inactive cycle transistor 19 is conducting so that node 53 is held to a logic low. Address signals A2–AN are all at a logic low during the inactive cycle so that transistors 17–18 are not conducting. With node 53 at a logic low, transistor 22 is not conducting. Transistor 21 is conducting so that node 54 is thus precharged to a logic high during the inactive cycle. During the inactive cycle the decoded address coupling signals VD∅–VD3 are all a logic high so that transistors 37–40 are all conducting which results in the control electrodes of transistors 23–26 all receiving a logic high. Word line drivers 23–26 are thus precharged to a conductive state during the inactive cycle. Decoded address coupling signals RS∅–RS3 are a logic low during the inactive cycle so that word lines WL1–WL4 are all held to a logic low via transistors 23–26. During the inactive cycle, signal RS is a logic low which causes transistors 43, 46, 49, and 52 to be in a non-conductive state so that node 54 is decoupled from word lines WL1–WL4.

The active cycle begins by signal R switching to a logic low which causes transistors 19 and 21 to become non-conductive. Transistors 17–18 respond to address signals A2–AN. Main decoder 11 is selected when all of the address signals received thereby remain at a logic low during the active cycle. When selected, node 53 remains at a logic low so that transistor 22 remains non-conductive and node 54 remains at a logic high. Main decoder 11 is deselected when one or more of the address signals received thereby switch to a logic high. Thus, when deselected, node 53 switches to a logic high causing transistor 22 to become conductive. Transistor 22 in a conductive state pulls node 54 to a logic low. Decoder 11 and inverter 12 thus provide a decoder function which provides a logic high when in the inactive cycle and when selected and provides a logic low when deselected.

All but one of signals VD∅–VD3 switch to a logic low at the beginning of the active cycle. The one that remains a logic high is considered active. A time delay later a corresponding signal among signals RS∅–RS3 switches to a logic high. Signals RS∅–RS3 and VD∅–VD3 are a decode of two address signals not shown which can be for example, A∅ and A1. These two address signals define one of four states which is manifested in one of signals VD∅–VD3 remaining at a logic high while the other three switch to a logic low during the active cycle. Signal VD∅ corresponds to signal RS∅, signal VD1 corresponds to signal RS1, signal VD2 corresponds to signal RS2, and signal VD3 corresponds to signal RS3. Each active cycle one of signals VD∅–VD3 remains at logic high and its corresponding decoded address driver signal (one of signals RS∅–RS3) switches to a logic high. For the case in which the decoder function provided by decoder 11 and inverter 12 is deselected, node 54 switches to a logic low after three of signals VD∅–VD3 switch to a logic low.

Assume for example that signal VD∅ is the active signal among signals VD∅–VD3. Before signals VD1–VD3 switch to a logic low, all of the control gates of transistors are precharged to a logic high. When signals VD1–VD3 switch to a logic low, transistors 38-40 become non-conductive which traps a logic high on the control gates of transistors 24-26. Transistors 24-26 thus remain conductive during the active cycle to couple signals RS1-RS3 to word lines WL2-WL4. For this example in which signal VD∅ remains a logic high during the active cycle, signals RS1-RS3 will remain at a logic low during the active cycle. Consequently, word lines WL2-WL4, which correspond to word lines driver transistors 24-26, will be held at a logic low by the corresponding signals RS1-RS3 which are inactive. This is true regardless of decoder selection or deselection because the control electodes of transistors 24-26 which correspond to inactive decoded signals RS1-RS3, are trapped at a logic high because node 54 is decoupled therefrom before the selection/deselection process affects node 54. Thus the word lines which correspond to inactive decoded address signals are ensured of being held at a logic low by the corresponding word line drivers during the active cycle.

For this example in which signals VD∅ and RS∅ are active, transistor 37 remains conductive during the active cycle because signal VD∅ remains a logic high. The control gate of transistor 23 receives the logic state of node 54 during the active cycle. When node 54 remains high, indicating selection, transistor 23 remains conductive during the active cycle. When signal RS∅, as the active decoded address signal, switches to a logic high, word line driver transistor 23 couples this decoded address signal to which it corresponds to word line WL1 to which diver transistor 23 also corresponds. For the case in which node 54 switches to a logic low, indicative of deselection, the control gate of transistor 23 is brought to a logic low so that transistor 23 is non-conductive. When active decoded address signal RS∅ switches to a logic high, transistor 23 does not couple it to the corresponding word line WL1. Word line WL1 is held to a logic low via transistors 41-43 which couple word line WL1 to node 54. Just after signal RS∅ switches to a logic high, signal RS switches to a logic high so that transistor 43 becomes conductive. Transistor 42, as a depletion device, is conductive regardless of the logic state of signal VD1. Signal VD∅, at a logic high, causes transistor 41 to be conductive. With transistors 41-43 being conductive, word line WL1 is coupled to node 54 which is a logic low for the deselected case. In the selected case the logic high present on the gates of transistors 41 and 43 will not exceed the logic high at node 54 sufficiently to exceed the threshold voltage of transistors 41 and 43 so that node 54 will not be coupled to word line WL1.

Depletion transistor 42 always functions to couple transistors 41 and 43 together. It is present as a convenient way to provide a connection and is similar to a diffusion type connection. Lines for carrying signals VD∅-VD3 traverse much of the array and prevent the diffusion type connection because the signal lines of silicide act as a mask for a diffusion or source/drain implant. Row decoder 10 takes advantage of the availability of silicide which allows for relatively long signal lines while retaining high speed operation. To form depletion transistors, an implant is performed which penetrates the gate electrode of the depletion transistor to cause it to have a negative threshold voltage. The result is a device which is conductive so long as the gate voltage does not go more negative than the threshold voltage. The lowest voltage attained by signals VD∅-VD3 is ground potential in the logic low state so that transistors 42, 44, 48, and 50 are always conductive and can simply be considered as short circuits.

Transistors 37-40 function to couple node 54, during the active cycle, to only the transistor among transistors 23-26 which corresponds to the signal among signals RS∅-RS3 that is active. During the inactive cycle, transistors 37-40 function to couple node 54 to all of transistors 23-26 which has the effect of precharging all of transistors 23-26 to a conductive state. Transistors 41, 43, 45, 46, 47, 49, 51, and 52 function to couple, during the active cycle, the word line among word lines WL1-WL4 which corresponds to the active signal among signals RS∅-RS3 to node 54 for the deselected case. Consequently row decoder 10 effectively holds word lines WL1-Wl4 at ground except when a word line is selected to be enabled, the desired result.

Figure 2:
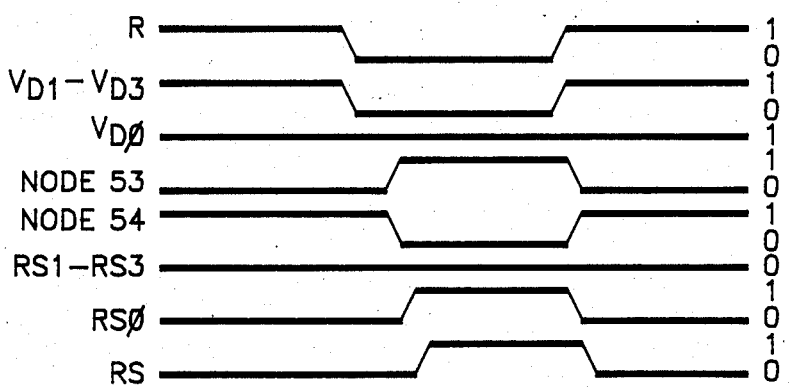
FIG. 2 is timing diagram for use in describing the operation of the decoder of claim 1.

Shown in FIG. 2 is a timing diagram for signals R, VD∅-VD3, and RS∅-RS3, and for the signals at nodes 53 and 54, for the deselected case in which signal VD∅ is active.

We claim:

1. A row decoder, having an active cycle and an inactive cycle, for enabling at least one of a plurality of word lines when selected, wherein an enabled word line corresponds to a decoded signal which is active, comprising:

a logic decoder having an input for receiving a plurality of address signals, and an output for providing an output signal at a first logic state during the inactive cycle, at the first logic state during the active cycle when the logic decoder is selected by the address signals, and at a second logic state during the active cycle when the logic decoder is deselected by the address signals;

a plurality of word line driver circuits, each coupling a respective one of the plurality of decoded signals to a corresponding word line when the first logic state is present on a control input thereof;

first coupling means for selecting a predetermined one of the word lines by coupling the output of the logic decoder to only that driver circuit which receives a decoded signal which is active during the active cycle, and for coupling the output of the logic decoder to all of the driver circuits during the inactive cycle; and second coupling means for coupling the selected word line to the output of the logic decoder when the logic decoder is deselected during the active cycle; and whereby the selected word line will be enabled only if the corresponding decoded address signal is active and the logic decoder is selected during the active cycle.

2. The row decoder of claim 1 wherein the logic decoder comprises:

an OR decoder having a plurality of inputs, each input for receiving one of the plurality of address signals, and an output; and an inverter having an input coupled to the output of the the OR decoder, and an output for providing the output of the logic decoder.

3. The row decoder of claim 2 wherein the OR decoder comprises:

a first transistor having a first current electrode coupled to a first power supply terminal, a second current electrode coupled to the output of the OR decoder, and a control electrode for receiving a first address signal;

a second transistor having a first current electrode coupled to the first power supply terminal, a second current electrode coupled to the output of the OR decoder, and a control electrode for receiving a second address signal; and a third transistor having a first current electrode coupled to a second power supply terminal, a second current electrode coupled to the output of the OR decoder, and a control electrode for receiving a row signal which is at the first logic state during the inactive cycle and at the second logic state during the active cycle.

4. The row decoder of claim 3 wherein the inverter comprises:

a fourth transistor having a control electrode coupled to the output of the OR decoder, a first current electrode coupled to the output of the logic decoder, and a second current electrode coupled to the second power supply terminal; and a fifth transistor having a control electrode for receiving the row signal, a first current electrode coupled to the output of the logic decoder, and a second current electrode coupled to the first power supply terminal.

5. The row decoder of claim 1 wherein the the plurality of word line driver circuits comprises:

a first transistor, as a first of the plurality of word line driver circuits, and having a control electrode as the control input, a first current electrode as the output coupled to a first of the plurality of word lines, and a second electrode as the driver input for receiving a first decoded address signal as the decoded address signal which corresponds to said first word line driver circuit; and a second transistor, as a second of the plurality of word line driver circuits, and having a control electrode as the control input, a first current electrode as the output coupled to a second of the plurality of word lines, and a second electrode as the driver input for receiving a second decoded address signal as the decoded address signal which corresponds to said second word line driver circuit.

6. The row decoder of claim 5 wherein the first coupling means comprises:

a third transistor having a first current electrode coupled to the output of the logic decoder, a second current electrode coupled to the control electrode of the first transistor, and a control electrode for receiving a third decoded address signal, said third decoded address signal being active in an active cycle only if the first decoded address signal is active in that active cycle; and a fourth transistor having a first current electrode coupled to the output of the logic decoder, a second current electrode coupled to the control electrode of the second transistor, and a control electrode for receiving a fourth decoded address signal, said fourth decoded address signal being active in an active cycle only if the second decoded address signal is active in that active cycle.

7. The row decoder of claim 6 wherein the second coupling means comprises:

a fifth transistor having a first current electrode coupled to the output of the logic decoder, a control electrode for receiving the third decoded address signal, and a second current electrode;

a sixth transistor having a first current electrode coupled to the second current electrode of the fifth transistor, a second current electrode coupled to the first word line, and a control electrode for receiving a driver active signal, said driver active signal being active only during the active cycle;

a seventh transistor having a first current electrode coupled to the output of the logic decoder, a control electrode for receiving the fourth decoded address signal, and a second current electrode; and an eighth transistor having a first current electrode coupled to the second current electrode of the seventh transistor, a second current electrode coupled to the second word line, and a control electrode for receiving the driver active signal.

8. A row decoder, which alternates between an active cycle and an inactive cycle, for enabling one of a plurality of word lines, comprising:

a logic decoder having an input for receiving a plurality of address signals, and an output for providing an output signal at a first logic state during the inactive cycle, at the first logic state during the active cycle when the logic decoder is selected by the address signals, and at a second logic state during the active cycle when the logic decoder is deselected by the address signals;

a first transistor, as a first of a plurality of word line driver circuits, and having a control electrode as the control input, a first current electrode as the output coupled to a first of the plurality of word lines, and a second electrode as the driver input for receiving a first decoded address signal as the decoded address signal which corresponds to said first word line driver circuit;

a second transistor, as a second of the plurality of word line driver circuits, and having a control electrode as the control input, a first current electrode as the output coupled to a second of the plurality of word lines, and a second electrode as the driver input for receiving a second decoded address signal as the decoded address signal which corresponds to said second word line driver circuit;

a third transistor having a first current electrode coupled to the output of the logic decoder, a second current electrode coupled to the control electrode of the first transistor, and a control electrode for receiving a third decoded address signal, said third decoded address signal being active in an active cycle only if the first decoded address signal is active in that active cycle;

a fourth transistor having a first current electrode coupled to the output of the logic decoder, a second current electrode coupled to the control electrode of the second transistor, and a control electrode for receiving a fourth decoded address signal, said fourth decoded address signal being active in an active cycle only if the second decoded address signal is active in that active cycle;

a fifth transistor having a first current electrode coupled to the output of the logic decoder, a control electrode for receiving the third decoded address signal, and a second current electrode;

a sixth transistor having a first current electrode coupled to the second current electrode of the fifth transistor, a second current electrode coupled to the first word line, and a control electrode for receiving a driver active signal, said driver active signal active only during the active cycle;
a seventh transistor having a first current electrode coupled to the output of the logic decoder, a control electrode for receiving the fourth decoded address signal, and a second current electrode; and
an eighth transistor having a first current electrode coupled to the second current electrode of the seventh transistor, a second current electrode coupled to the second word line, and a control electrode for receiving the driver active signal.

9. The row decoder of claim 8 wherein the logic decoder comprises:
an OR decoder having a plurality of inputs, each input for receiving one of the plurality of address signals, and an output; and
an inverter having an input coupled to the output of the the OR decoder, and an output for providing the output of the logic decoder.

10. A row decoder, having an active cycle and an inactive cycle, for enabling at least one of a plurality of word lines when selected, wherein an enabled word line corresponds to a decoded signal which is active, comprising:
A logic decoder having an input for receiving a plurality of address signals, and an output for providing an output signal at a first logic state during the inactive cycle, at the first logic state during the active cycle when the logic decoder is selected by the address signals, and at a second logic state during the active cycle when the logic decoder is deselected by the address signals;
a plurality of word line driver circuits, each having a control input, a driver input for receiving a decoded signal which corresponds to the driver circuit, and an output coupled to a corresponding word line which corresponds to the driver circuit, each for coupling the corresponding decoded signal to the corresponding word line when the first logic state is present on the control input;
first coupling means for coupling the output of the logic decoder to only the driver circuit which corresponds to the active decoded signal during the active cycle, and for coupling the output of the logic decoder to all of the purality of word line driver circuits during the inactive cycle; and
second coupling means for coupling the word line, which corresponds to the active decoded signal, to the output of the logic decoder when the logic decoder is deselected during the active cycle.

11. The row decoder of claim 10 wherein the logic decoder comprises:
an OR decoder having a plurality of inputs, each input for receiving one of the plurality of address signals, and an output; and
an inverter having an input coupled to the output of the the OR decoder, and an output for providing the output of the logic decoder.

12. The row decoder of claim 11 wherein the OR decoder comprises:
a first transistor having a first current electrode coupled to a first power supply terminal, a second current electrode coupled to the output of the OR decoder, and a control electrode for receiving a first address signal;
a second transistor having a first current electrode coupled to the first power supply terminal, a second current electrode coupled to the output of the OR decoder, and a control electrode for receiving a second address signal; and
a third transistor having a first current electrode coupled to a second power supply terminal, a second current electrode coupled to the output of the OR decoder, and a control electrode for receiving a row signal which is at the first logic state during the inactive cycle and at the second logic stated during the active cycle.

13. The row decoder of claim 12 wherein the inverter comprises:
a fourth transistor having a control electrode coupled to the output of the OR decoder, a first current electrode coupled to the output of the logic decoder, and a second current electrode coupled to the second power supply terminal; and
a fifth transistor having a control electrode for receiving the row signal, a first current electrode coupled to the output of the logic decoder, and a second current electrode coupled to the first power supply terminal.

14. The row decoder of claim 10 wherein the the plurality of word line driver circuits comprises:
a first transistor, as a first of the plurality of word line driver circuits, and having a control electrode as the control input, a first current electrode as the output coupled to a first of the plurality of word lines, and a second electrode as the driver input for receiving a first decoded address signal as the decoded address signal which corresponds to˙ said first word line drive circuit; and
a second transistor, as a second of the plurality of word line driver circuits, and having a control electrode as the control input, a first current electrode as the output coupled to a second of the plurality of word lines, and a second electrode as the driver input for receiving a second decoded address signal as the decoded address signal which corresponds to said second word line driver circuit.

15. The row decoder of claim 14 wherein the first coupling means comprises:
a third transistor having a first current electrode coupled to the output of the logic decoder, a second current electrode coupled to the control electrode of the first transistor, and a control electrode for receiving a third decoded address signal, said third decoded address signal being active in an active cycle only if the first decoded address signal is active in that active cycle; and
a fourth transistor having a first current electrode coupled to the output of the logic decoder, a second current electrode coupled to the control electrode of the second transistor, and a control electrode for receiving a fourth decoded address signal, said fourth decoded address signal being active in an active cycle only if the second decoded address signal is active in that active cycle.

16. The row decoder of claim 15 wherein the second coupling means comprises:
a fifth transistor having a first current electrode coupled to the output of the logic decoder, a control electrode for receiving the third decoded address signal, and a second current electrode;
a sixth transistor having a first current electrode coupled to the second current electrode of the fifth transistor, a second current electrode coupled to the first word line, and a control electrode for receiving a driver active signal, said driver active signal active only during the active cycle;

a seventh transistor having a first current electrode coupled to the output of the logic decoder, a control electrode for receiving the fourth decoded address signal, and a second current electrode; and an eighth transistor having a first current electrode coupled to the second current electrode of the seventh transistor, a second current electrode coupled to the second word line, and a control electrode for receiving the driver active signal.

* * * * *